US010663549B2

(12) United States Patent
Mailhe et al.

(10) Patent No.: US 10,663,549 B2
(45) Date of Patent: May 26, 2020

(54) COMPRESSED SENSING RECONSTRUCTION FOR MULTI-SLICE AND MULTI-SLAB ACQUISITIONS

(71) Applicant: Siemens Healthcare GmbH, Erlangen (DE)

(72) Inventors: Boris Mailhe, Plainsboro, NJ (US); Mariappan S. Nadar, Plainsboro, NJ (US); Aurélien Stalder, Erlangen (DE); Qiu Wang, Princeton, NJ (US); Michael Zenge, Nuremberg (DE)

(73) Assignee: Siemens Healthcare GmbH, Erlangen (DE)

( * ) Notice: Subject to any disclaimer, the term of this patent is extended or adjusted under 35 U.S.C. 154(b) by 1291 days.

(21) Appl. No.: 14/552,539

(22) Filed: Nov. 25, 2014

(65) Prior Publication Data

US 2016/0146915 A1    May 26, 2016

(51) Int. Cl.
*G01R 33/56*    (2006.01)
*G01R 33/48*    (2006.01)
(Continued)

(52) U.S. Cl.
CPC ..... *G01R 33/5608* (2013.01); *G01R 33/4818* (2013.01); *G01R 33/5611* (2013.01); *G01R 33/4835* (2013.01)

(58) Field of Classification Search
CPC .............. G01R 33/48; G01R 33/4818; G01R 33/4835; G01R 33/56; G01R 33/5608; G01R 33/5611
See application file for complete search history.

(56) References Cited

U.S. PATENT DOCUMENTS 6,554,769 B1 *   4/2003   Friedman ............ G01S 7/52034
                                                128/916
2012/0002854 A1*   1/2012   Khare .................... G06T 11/006
                                                382/131
(Continued)

FOREIGN PATENT DOCUMENTS

CN        1212145 A      3/1999
CN      102389309 A      3/2012
(Continued)

OTHER PUBLICATIONS

EP Search Report in EP Application No. 15194865.0, dated Apr. 29, 2016, 12 pages.
(Continued)

*Primary Examiner* — Son T Le (57) ABSTRACT

A method for acquiring a three-dimensional image volume using a magnetic resonance imaging device includes performing a multi-slice or multi-slab acquisition process to acquire a plurality of slices or three-dimensional slabs corresponding to an imaged object. Each respective slice or three-dimensional slab included in the plurality of slices or three-dimensional slabs comprises k-space data. An iterative compressed-sensing reconstruction process is applied to jointly reconstruct the plurality of three-dimensional slabs as a single consistent volume. The iterative compressed-sensing reconstruction process solves a cost function comprising a summation of individual data fidelity terms corresponding to the plurality of three-dimensional slabs.

20 Claims, 5 Drawing Sheets

(51) Int. Cl.
*G01R 33/561* (2006.01)
*G01R 33/483* (2006.01)

(56) References Cited

U.S. PATENT DOCUMENTS

| | | | |
|---|---|---|---|
| 2012/0146641 A1 | 6/2012 | Wu et al. | |
| 2013/0182930 A1 | 7/2013 | Trzasko et al. | |
| 2013/0221961 A1* | 8/2013 | Liu | G01R 33/56545 324/307 |
| 2013/0310678 A1* | 11/2013 | Balbi | A61B 5/055 600/410 |
| 2014/0286560 A1* | 9/2014 | Trzasko | G01R 33/5611 382/131 |
| 2015/0123659 A1* | 5/2015 | Weingartner | A61B 5/055 324/309 |
| 2015/0177349 A1* | 6/2015 | Foxall | G01R 33/4806 324/309 |
| 2015/0301145 A1* | 10/2015 | Kerr | G01R 33/5611 324/309 |
| 2015/0346303 A1* | 12/2015 | Hu | G01R 33/5601 600/420 |
| 2016/0069974 A1* | 3/2016 | Lee | G01R 33/4835 324/309 |

FOREIGN PATENT DOCUMENTS

| | | |
|---|---|---|
| CN | 102906791 A | 1/2013 |
| JP | 2014508622 A | 4/2014 |
| KR | 20140025267 A | 3/2014 |
| WO | 2014024085 A2 | 2/2014 |
| WO | 2014147508 A2 | 9/2014 |

OTHER PUBLICATIONS

Weizman, Lior, et al. "Exploiting similarity in adjacent slices for compressed sensing MRI." 2014 36th Annual International Conference of the IEEE Engineering in Medicine and Biology Society. IEEE, Aug. 26, 2014, pp. 1549-1552.

Adluru, G, et al. "Radial CAIPI-CS for simultaneous multi-slice cardiac perfusion imaging"; Proceedings of the International Society for Magnetic Resonance in Medicine; ISMRM; Joint Annual Meeting ISMRM-ESMRMB, Milan, Italy, May 10-16, 2014, No. 1532.

Song, Ying, et al. "Reconstruction of magnetic resonance imaging by three-dimensional dual-dictionary learning." Magnetic resonance in medicine 71.3 (2014): pp. 1285-1298.

Mandava, S, et al. "Accelerating encoded simultaneous multi slice MRI with compressed sensing"; Proceedings of the International Society for Magnetic Resonance in Medicine; ISMRM; 21st Annual Meeting and Exhibition, Salt Lake city; Utah, USA; pp. 604.

Natsuaki, Y., et al. "Time-of-flight with sparse undersampling (TOFu): towards practical MR applications of the compressed sensing." Proceedings of the 22nd Annual Meeting of ISMRM, Milan, Italy. 2014, No. 941.

Beck, Amir, and Marc Teboulle. "A fast iterative shrinkage-thresholding algorithm for linear inverse problems." SIAM journal on imaging sciences 2.1 (2009): 183-202.

Lustig, Michael, David Donoho, and John M. Pauly. "Sparse MRI: The application of compressed sensing for rapid MR maging." Magnetic resonance in medicine 58.6 (2007): 1182-1195.

Office action dated Apr. 3, 2017 in Korean Application No. KR 10-2015-0164798, 17 pages (English translation attached).

Islam Rafiqul et al; "A wavelet-based super-resolution method for multi-slice MRI"; J.Biomedical Science and Engineering vol. 5; pp. 862-870, May 2012.

* cited by examiner

COMPRESSED SENSING RECONSTRUCTION FOR MULTI-SLICE AND MULTI-SLAB ACQUISITIONS

TECHNOLOGY FIELD

The present invention relates generally to methods, systems, and apparatuses for Magnetic Resonance Imaging (MRI) multi-slice and multi-slab acquisitions where acquired data is reconstructed using compressed-sensing techniques. The disclosed methods, systems, and apparatuses may be applied to various MRI applications including, for example, angiography imaging.

BACKGROUND

In the context of Magnetic Resonance Imaging (MRI), the term multi-slab imaging refers to the acquisition of multiple 3D volumes during a single scan. One conventional example of multi-slab imaging is the Time of Flight (TOF) technique where the blood inflow of non-saturated spins is used to depict blood vessels. As a result of being non-saturated, these spins give more signal than surrounding stationary spins. With this technique, it is essential to acquire data in thin-slab so as to optimize the vessel contrast.

Unfortunately, multi-slab acquisitions result in individual matrices each of limited size (in particular, in the slab direction). The individual reconstruction of such slabs results in limited incoherence. In turn, this limits the acceleration potential of the acquisition and may reduce image quality. Accordingly, it is desired to provide a reconstruction technique which addresses these and other issues associated with multi-slab acquisitions to allow slabs to be acquired in accelerated, or otherwise undersampled, scenarios, without degrading the quality of resulting images.

SUMMARY

Embodiments of the present invention address and overcome one or more of the above shortcomings and drawbacks, by providing methods, systems, and apparatuses related to a multi-slab acquisition techniques wherein the image reconstruction is performed using the combined information of all the slabs at once. The proposed schemes may lead to an improvement in image quality and signal-to-noise ratio (SNR) in various multi-slab applications.

According to some embodiments, a method for acquiring a three-dimensional image volume using a magnetic resonance imaging device includes performing a multi-slice or multi-slab acquisition process to acquire a plurality of slices or three-dimensional slabs corresponding to an imaged object. Each respective slice or three-dimensional slab included in the plurality of slices or three-dimensional slabs comprises k-space data. An iterative compressed-sensing reconstruction process is applied to jointly reconstruct the plurality of three-dimensional slabs as a single consistent volume. The iterative compressed-sensing reconstruction process used in the aforementioned method solves a cost function comprising a summation of individual data fidelity terms corresponding to the plurality of three-dimensional slabs. In one embodiment, each individual data fidelity term corresponds to a comparison of k-space data associated with a respective slice or three-dimensional slab and a masked region of a current estimated image volume corresponding to the respective slice or three-dimensional slab. The masked region of the current estimated image volume may be, for example, a zero-padded matrix of data with non-zero data elements at positions corresponding to the respective slice or three-dimensional slab.

Various techniques may be used for solving the cost function used in the aforementioned method. For example, in some embodiments, the iterative compressed-sensing reconstruction process uses a proximal gradient algorithm to solve the cost function over a plurality of iterations. In some embodiments, the cost function further includes a regularization portion which is independent of a total number of slices or three-dimensional slabs. This regularization portion may be used, for example, to apply a wavelet transform to a current estimated image volume during each iteration.

Additionally, the details of the acquisition process used in the aforementioned method may vary. For example, in one embodiment, the acquisition process performs incoherent undersampling of the imaged object along a slab direction. In other embodiments, the acquisition process employs an accelerated 3D TOF sampling strategy. This 3D TOF sampling strategy may employ, for example, variable density spiral phyllotaxis, or variable density Poisson patterns in ky-kz phase-encoding directions.

According to other embodiments, an article of manufacture for acquiring a three-dimensional image volume using a magnetic resonance imaging device comprises a non-transitory, tangible computer-readable medium holding computer-executable instructions for performing a method comprising two steps. First, a plurality of coils included in the magnetic resonance imaging device is used to perform an undersampled multi-slab scan of a region of interest to yield a plurality of three-dimensional slabs. Various techniques may be used for performing this scan. For example, in one embodiment, the scan is performed using incoherent undersampling of the region of interest along a slab direction. Once the three-dimensional slabs are acquired, they are jointly reconstructed as a single consistent volume by solving a cost function which comprises a summation of individual data fidelity terms corresponding to three-dimensional slabs.

The method performed by the aforementioned article of manufacture may have various additional features. For example, in one embodiment, each individual data fidelity term used in the cost function corresponds to a comparison of k-space data associated with a respective three-dimensional slab and a masked region of a current estimated image volume corresponding to the respective three-dimensional slab. The masked region of the current estimated image volume may be, for example, a zero-padded matrix of data with non-zero data elements at positions corresponding to the respective three-dimensional slab. In some embodiments, the cost function also includes a regularization portion which is independent of a total number of three-dimensional slabs and may be used in an iterative optimization algorithm (e.g., proximal gradient) to apply a wavelet transform to a current estimated image volume during each iteration. In some embodiments, the three-dimensional slabs are acquired using an accelerated 3D TOF sampling strategy which may employ a variable density spiral phyllotaxis trajectory in ky-kz phase-encoding directions.

According to other embodiments, a system for performing multi-slab acquisitions with compressed sensing reconstruction includes an imaging device and a central control computer. The imaging device includes a plurality of coils which are configured to acquire a plurality of three-dimensional slabs corresponding to an imaged object. Each respective three-dimensional slab included in the plurality of three-dimensional slabs comprises k-space data. The central control computer unit is configured to apply an iterative compressed-sensing reconstruction process to the plurality of three-dimensional slabs to yield an image volume. This process solves a cost function comprising a summation of individual data fidelity terms corresponding to the plurality of three-dimensional slabs. In one embodiment, the central control computer unit is further configured to use a proximal gradient algorithm during the iterative compressed-sensing reconstruction process to solve the cost function over a plurality of iterations.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there is shown in the drawings embodiments that are presently preferred, it being understood, however, that the invention is not limited to the specific instrumentalities disclosed. Included in the drawings are the following Figures.

DETAILED DESCRIPTION OF ILLUSTRATIVE EMBODIMENTS

The following disclosure describes the present invention according to several embodiments directed at methods, systems, and apparatuses for multi-slab Magnetic Resonance Imaging (MRI) acquisitions, wherein image reconstruction is performed using the combined information of all the slabs at once. All of the acquired slabs are reconstructed together and regularized as a single consistent volume which may improve image quality and signal-to-noise ratio (SNR) compared to conventional multi-slab acquisition techniques. For example, the techniques described herein should help to mitigate slab artifacts such as discontinuities at the boundary between two non-overlapping slabs or blurring of regions of overlap between slabs, thus improving overall image quality. Moreover, since the reconstruction is iterative, the only operator needed is the measurement operator and other operators (e.g., the linear reconstruction operator) do not need to be considered. This makes the techniques compatible with any slab thickness and overlap pattern, thus correcting intensity inhomogeneities in regions of overlap and allowing more flexibility in the design of the acquisition protocol. The disclosed methods, systems, and apparatuses may be applied to various multi-slab applications including, for example, TOF angiography MRI applications.

Figure 1:
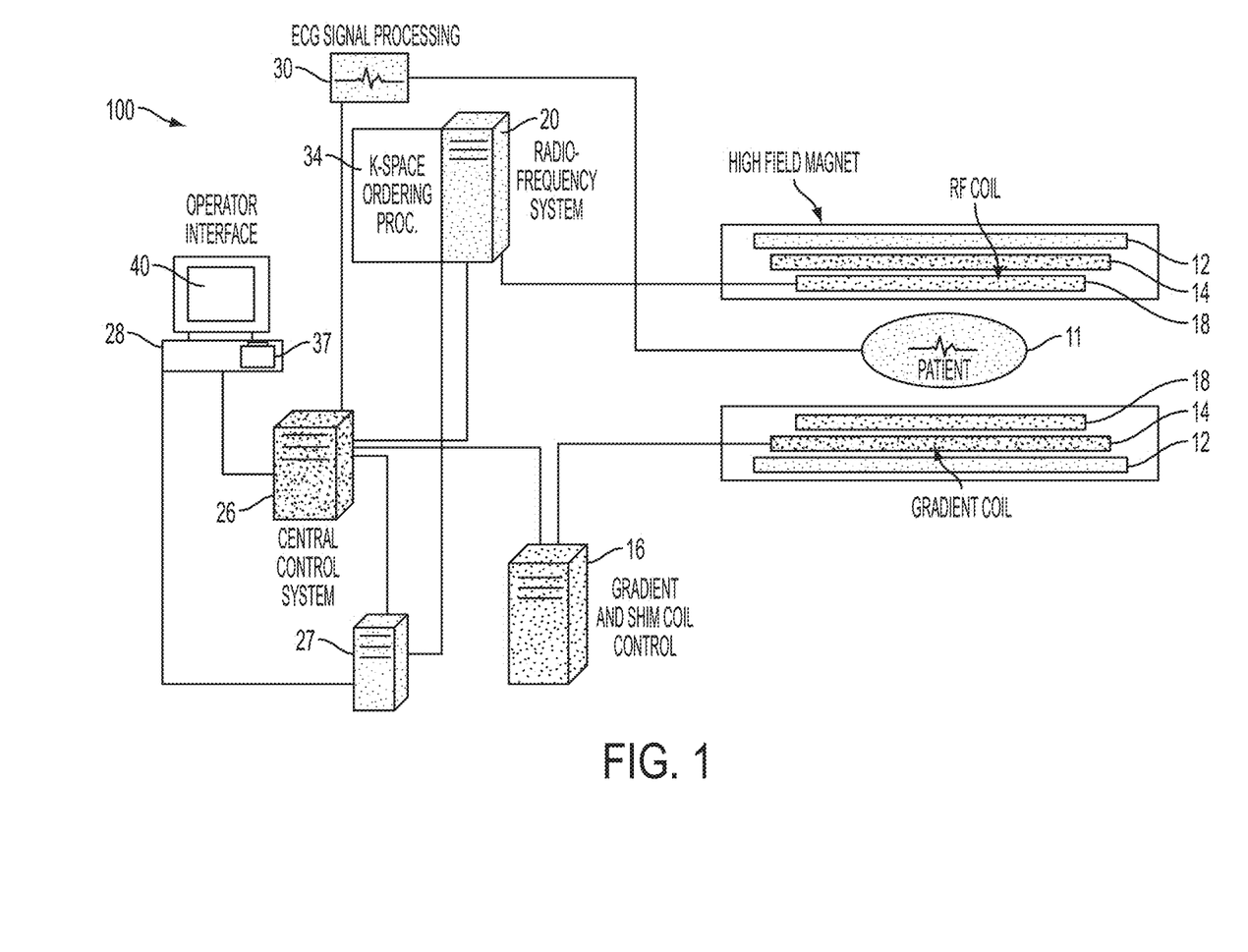
FIG. 1 shows a system for ordering acquisition of frequency domain components representing magnetic resonance (MR) image data for storage in a k-space storage array, as used by some embodiments of the present invention.

FIG. 1 shows a system 100 for ordering acquisition of frequency domain components representing MR image data for storage in a k-space storage array, as used by some embodiments of the present invention. In system 100, magnetic coils 12 create a static base magnetic field in the body of patient 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field and a readout gradient magnetic field that are applied to patient 11.

Further RF (radio frequency) module 20 provides RF pulse signals to RF coil 18, which in response produces magnetic field pulses which rotate the spins of the protons in the imaged body of the patient 11 by ninety degrees or by one hundred and eighty degrees for so-called "spin echo" imaging, or by angles less than or equal to 90 degrees for so-called "gradient echo" imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of patient 11. For example, as described in greater detail below, in some embodiments, the central control unit 26 directs the various components of the system 100 to acquire radial k-space data using a bSSFP sequence with an interleaved-angle asymmetric radial sampling scheme.

In response to applied RF pulse signals, the RF coil 18 receives MR signals, i.e., signals from the excited protons within the body as they return to an equilibrium position established by the static and gradient magnetic fields. The MR signals are detected and processed by a detector within RF module 20 and k-space component processor unit 34 to provide an MR dataset to an image data processor for processing into an image. In some embodiments, the image data processor is located in central control unit 26. However, in other embodiments such as the one depicted in FIG. 1, the image data processor is located in a separate unit 27. ECG synchronization signal generator 30 provides ECG signals used for pulse sequence and imaging synchronization. A two or three dimensional k-space storage array of individual data elements in k-space component processor unit 34 stores corresponding individual frequency components comprising an MR dataset. The k-space array of individual data elements has a designated center and individual data elements individually have a radius to the designated center.

A magnetic field generator (comprising coils 12, 14 and 18) generates a magnetic field for use in acquiring multiple individual frequency components corresponding to individual data elements in the storage array. The individual frequency components are successively acquired in an order in which radius of respective corresponding individual data elements increases and decreases along a substantially spiral path as the multiple individual frequency components is sequentially acquired during acquisition of an MR dataset representing an MR image. A storage processor in the k-space component processor unit 34 stores individual frequency components acquired using the magnetic field in corresponding individual data elements in the array. The radius of respective corresponding individual data elements alternately increases and decreases as multiple sequential individual frequency components are acquired. The magnetic field acquires individual frequency components in an order corresponding to a sequence of substantially adjacent individual data elements in the array and magnetic field gradient change between successively acquired frequency components is substantially minimized.

Central control unit 26 uses information stored in an internal database to process the detected MR signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control unit 26 and enables user modification of magnetic resonance imaging signals in substantially real time. Display processor 37 processes the magnetic resonance signals to provide image representative data for display on display 40, for example.

Using techniques described herein, the system 100 illustrated in FIG. 1 may be applied to perform an iterative multi-slab acquisition and reconstruction technique wherein three-dimensional slabs are jointly reconstructed as a single consistent volume In conventional separate multi-slab reconstruction techniques, each slab is reconstructed from its k-space measurements. The whole volume is reconstructed by "stitching" the slabs together. This can result in artifacts at slab boundaries. Additionally, the sampling pattern is limited by the quality to achieve each slab. The drawbacks of the multi-slab reconstruction techniques are overcome by utilizing a joint reconstruction technique where the only unknown at reconstruction is the whole volume. Even where the slabs would overlap, each pixel of the final volume is only reconstructed once. Thus, there is no slab stitching required. Moreover, using joint reconstruction as described herein, the regularization term in the reconstruction equation is independent of the slab pattern. This may result, for example, in better global sampling patterns.

Figure 2:
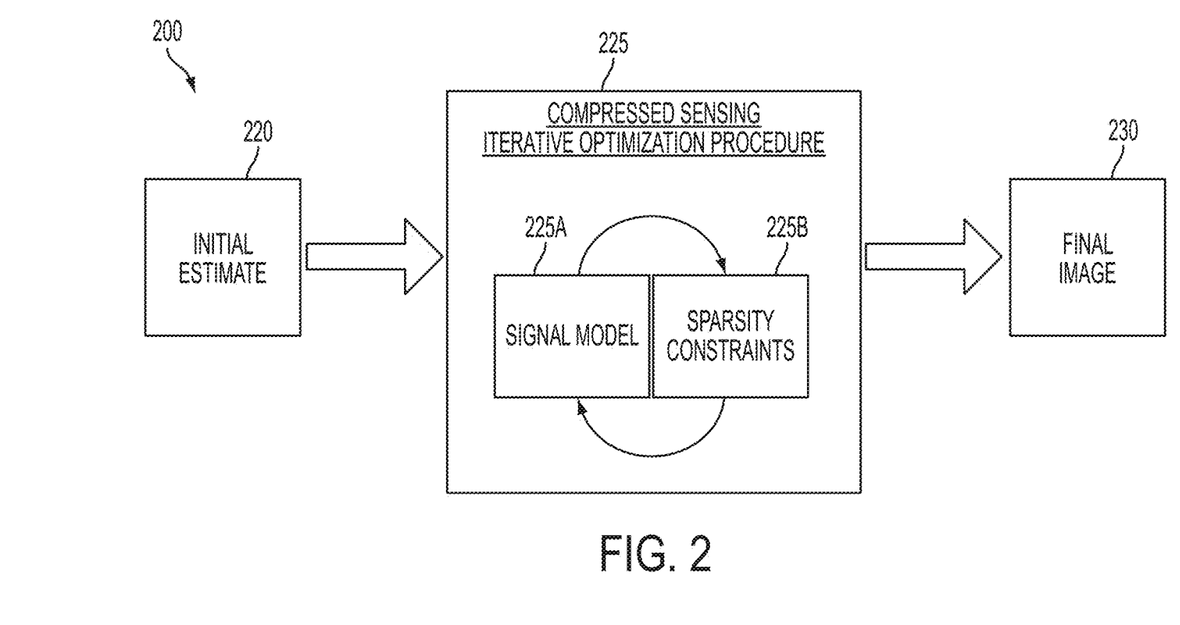
FIG. 2 provides a high-level illustration of an iterative reconstruction framework, as may be applied using the system of FIG. 1, according to some embodiments of the present invention.

FIG. 2 provides a high-level illustration of an iterative reconstruction framework 200, as may be applied using the system 100 of FIG. 1, according to some embodiments of the present invention. Briefly, an initial image 220 is used as an estimate for a numerical optimization procedure 225 which iteratively updates the estimate to result in a final image 230. The numerical optimization procedure 225 includes a cost function and an iterative algorithm for minimizing the function based on the estimate provided by the initial image 220. The iterative algorithm includes some stopping criterion for terminating the iterations. For example, in some embodiments, the image results between iterations are compared and, if the differences are less than a predetermined threshold, the algorithm stops and the final image 230 is produced. The cost function used by numerical optimization procedure 225 applies a signal model 225A which enforces consistency with the measured data using mathematical modeling of the MRI signal. The cost function also typically includes one or more sparsity constraints 225B (i.e., penalty terms) which enforce consistency with prior knowledge such as the sparsity in transform basis.

The iterative reconstruction framework 200 may be used to jointly reconstruct multi-slab data by using the numerical optimization procedure 225 to solve a cost function in which all slabs are reconstructed together and regularized as a single consistent volume. For the special case where no incoherent undersampling is performed in the slab direction, it is possible to perform the reconstruction in the slab direction first and then combine the different slabs before running the iterative compressed-sensing reconstruction over the whole volume. However, in other embodiments, the different slabs may be combined implicitly in the forward imaging operator during the iterative compressed-sensing reconstruction. The iterative reconstruction algorithm considers the whole volume as the unknown to be estimated. The cost function to be solved in the compressed-sensing algorithms contains the data fidelity term and the sparsity-prior term. In the sparsity-prior term, since the unknown is the whole volume, any sparse transform may be directly applied to the entire volume. The data fidelity term of the reconstruction cost function compares the difference between the k-space data and the current estimated volume. In various embodiments, this term is a summation of the data fidelity from each individual slab. For each slab, the k-space data from the current slab and the masked region of the particular slab from the whole volume may be compared.

Various cost functions may be used to achieve the goal of joint reconstruction of multi-slab acquisition data. For example, in some embodiments, this cost function shown in Equation 1 is applied during the numerical optimization procedure 225:

$$f = \text{argmax}_f \frac{1}{2} \sum_{n_s=1}^{N_c} \left( \sum_{n_c=1}^{N_s} \|G_{n_s,n_c} - F_u(S_{n_s,n_c} \odot \Pi_{n_s} f)\|_2^2 \right) + \lambda \|\Lambda \odot (Wf)\|_1 \quad (1)$$

In Equation 1, f is a one-dimensional vector which is the vectorized version of the signal to be reconstructed (e.g., an image). The vector f may be generated, for example, by concatenating columns of the signal together vertically. $N_c$ is the number of coils used by the MR device, while $N_s$ is the number of slabs. $F_u$ is a measurement matrix. $G_{n_s,n_c}$ is the measured data for a particular coil and particular slab, while $S_{n_s,n_s}$ is the coil sensitivity profile for a particular coil and particular slab. The operator $\Pi_{n_s}$ is applied to f to extract a particular slab $n_s$ from the overall volume.

In Equation 1, $\lambda \|\Lambda \odot (Wf)\|_1$ is a regularization term which provides a measure of how consistent the solution is with the private knowledge. The regularization term is the $l_1$-norm of the signal in the transform domain, where W represents the redundant Haar wavelet transform, $\Lambda$ is a regularization weighting factor, and $\lambda$ is a regularization parameter governing the tradeoff between the data fidelity and its sparsity. Note that the regularization term $\lambda \|\Lambda \odot (Wf)\|_1$ describes the sparsity constraints, independent of the slabs.

There are numerous techniques known in the art that may be used to solve cost functions in numerical optimization procedures. In some embodiments, a proximal gradient algorithm may be used to solve Equation 1. As is well understood in the art, proximal gradient methods are a generalized form of projection used to solve non-differentiable convex optimization problems such as Equation 1. Non-limiting examples of proximal gradient algorithms include fast iterative shrinkage thresholding algorithm (FISTA), projected gradient, alternating projections, and alternating-direction method of multipliers (ADMM) may be applied. The implementation of each algorithm is based on the cost function itself and, thus, reflects the details of the original problem. With respect to Equation 1, a proximal gradient technique may be used which includes terms which reflect multi-slab processing. For example, in one embodiment, for a step size of L, the following equations may be used:

$$f_{n+0.5} \leftarrow f_n + \frac{\nabla_n}{L} \quad (2)$$

$$f_{n+1} \leftarrow \operatorname{argmin}_f \frac{L}{2}\|f - f_{n+0.5}\|_2^2 + \lambda \|\Lambda \odot (Wf)\|_1 \quad (3)$$

Note that the proximal portion of the algorithm (Equation 3) is not specific to multi-slab. The gradient of the data fitting term $\nabla_n$ of Equation 2 may be determined by:

$$\nabla_n = \sum_{n_s=1}^{N_s} \sum_{n_c=1}^{N_c} \Pi_{n_s}^H (S_{n_s,n_c}^{(H)} \odot F_s^H (G_{n_s,n_c} - F_u(S_{n_s,n_c} \odot \Pi_{n_s} f))) \quad (4)$$

With the $\Pi_{n_s}^H$ term in Equation 4, a slab is embedded in a whole volume at position $n_s$ by zero-padding. Equations 2-4 illustrate several benefits of multi-slab reconstruction, as described in some of the embodiments of the present invention. For example, there is no need to express the inverse of the multi-slab measurement operator, only its adjoint. Moreover, there is no need to transform the k-space before reconstruction. The technique is also compatible with any slab pattern and any sampling pattern within the slabs.

Figure 3:
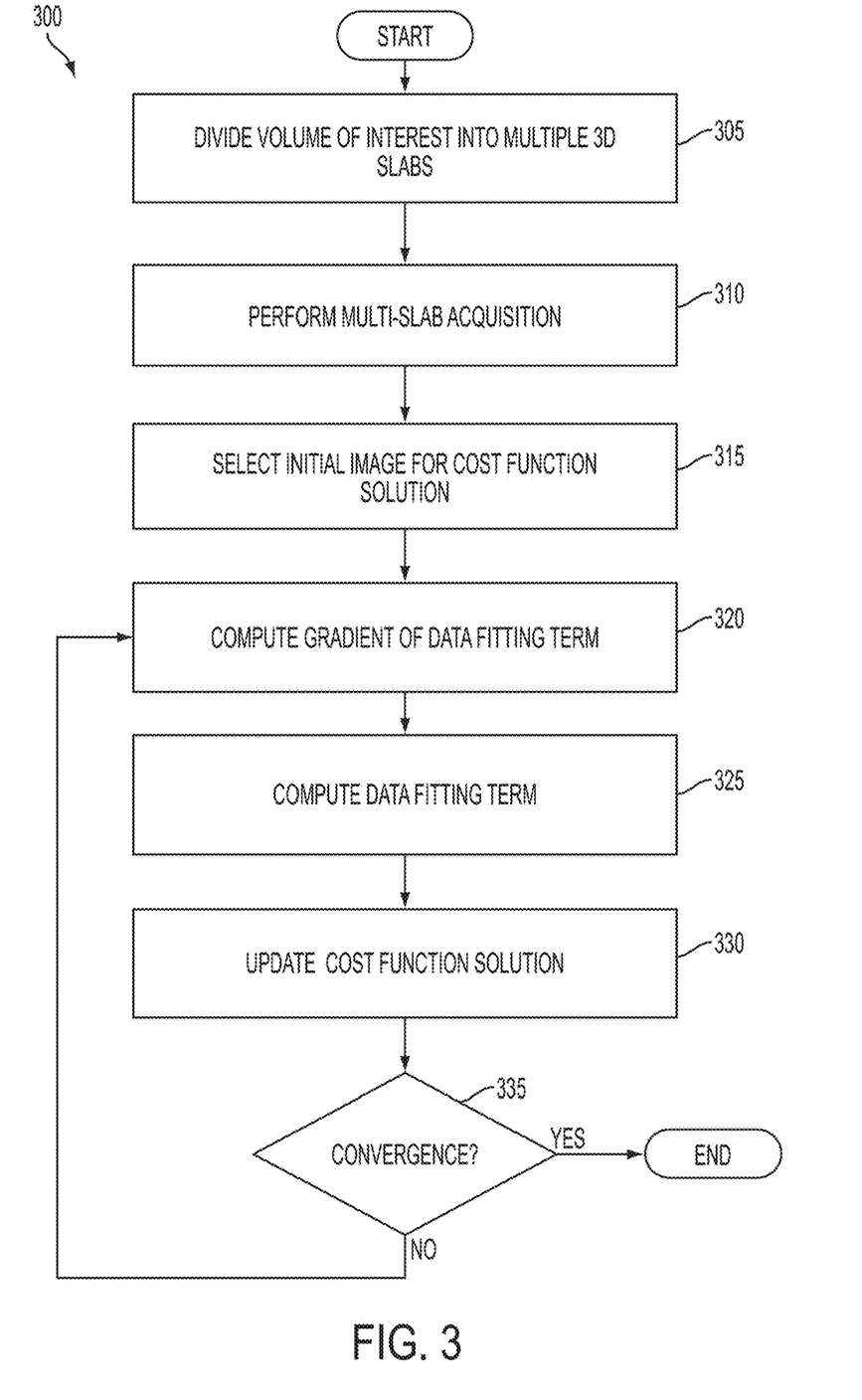
FIG. 3 provides an illustration of a process for jointly reconstructing a plurality of slabs acquired using a multi-slab scan, according to some embodiments.

FIG. 3 provides an illustration of a process 300 for jointly reconstructing a plurality of slabs acquired using a multi-slab scan, according to some embodiments. More specifically, this process 300 illustrates how multi-slab acquisitions can be combined with joint reconstruction techniques according to Equation 1 to yield a high fidelity image of an object of interest. At step 305, a volume comprising the object of interest in divided into a plurality of three-dimensional slabs. Various techniques known in the art may be used for dividing the region and different slab characteristics may be dependent on the clinical application. For example, for anatomical applications involving imaging of blood movement through vessels, very thin (e.g. 2 cm) slabs may be used, positioned perpendicular to the blood flow.

Next, at step 310, an imaging device (see, e.g., FIG. 1) performs a multi-slab acquisition process to acquire k-space data corresponding to the three-dimensional slabs. Various techniques known in the art may be used to perform the acquisition. Because compressed sensing reconstruction will be applied to the slabs, incoherent sampling may be used to achieve high acceleration factors during the acquisition process. Various techniques may be used to increase the incoherence of the sampled data. For example, in some embodiments, variable density sampling trajectories (e.g., using spiral phyllotaxis or variable density Poisson patterns) may be used to ensure that the slabs are incoherent by increasing the size of the acquisition matrix. As the sample size is increased, incoherence is asymptotically increased and, in turn, the reconstructed image quality may be improved. One example of a technique for increasing the acquisition matrix to produce incoherence may be found in U.S. patent application Ser. No. 14/515,714, filed Oct. 16, 2014 and incorporated herein by reference. Additionally, the multi-slab acquisition process may be tailored to the clinical application. For example, in some embodiments, the multi-slab acquisition process employs an accelerated 3D TOF sampling strategy for an angiography application.

Returning to FIG. 3, iterative reconstruction is illustrated in steps 315-335. In this example, the iterative compressed-sensing reconstruction process solves a cost function comprising a summation of individual data fidelity terms corresponding to the plurality of three-dimensional slabs. At step 315 an initial image for the cost function solution is selected. This initial image may be, for example, an earlier acquired image representing the area of interest, either taken from the same subject or another subject presenting similar features. Next, at step 320 the gradient of the data fitting term is calculated using, for example, Equation 4. Based on this gradient, at step 325, the data fitting term is calculated using Equation 2. Then, at step 330, the cost function solution is updated using Equation 3. At step 335, the result of solving the cost function is compared to the results of the previous iteration to test for convergence. If the results indicate convergence (e.g., the difference is less than a predetermined threshold value), the algorithm stops. Otherwise, it continues back at 320, with another iteration through the fitting process.

Figure 4:
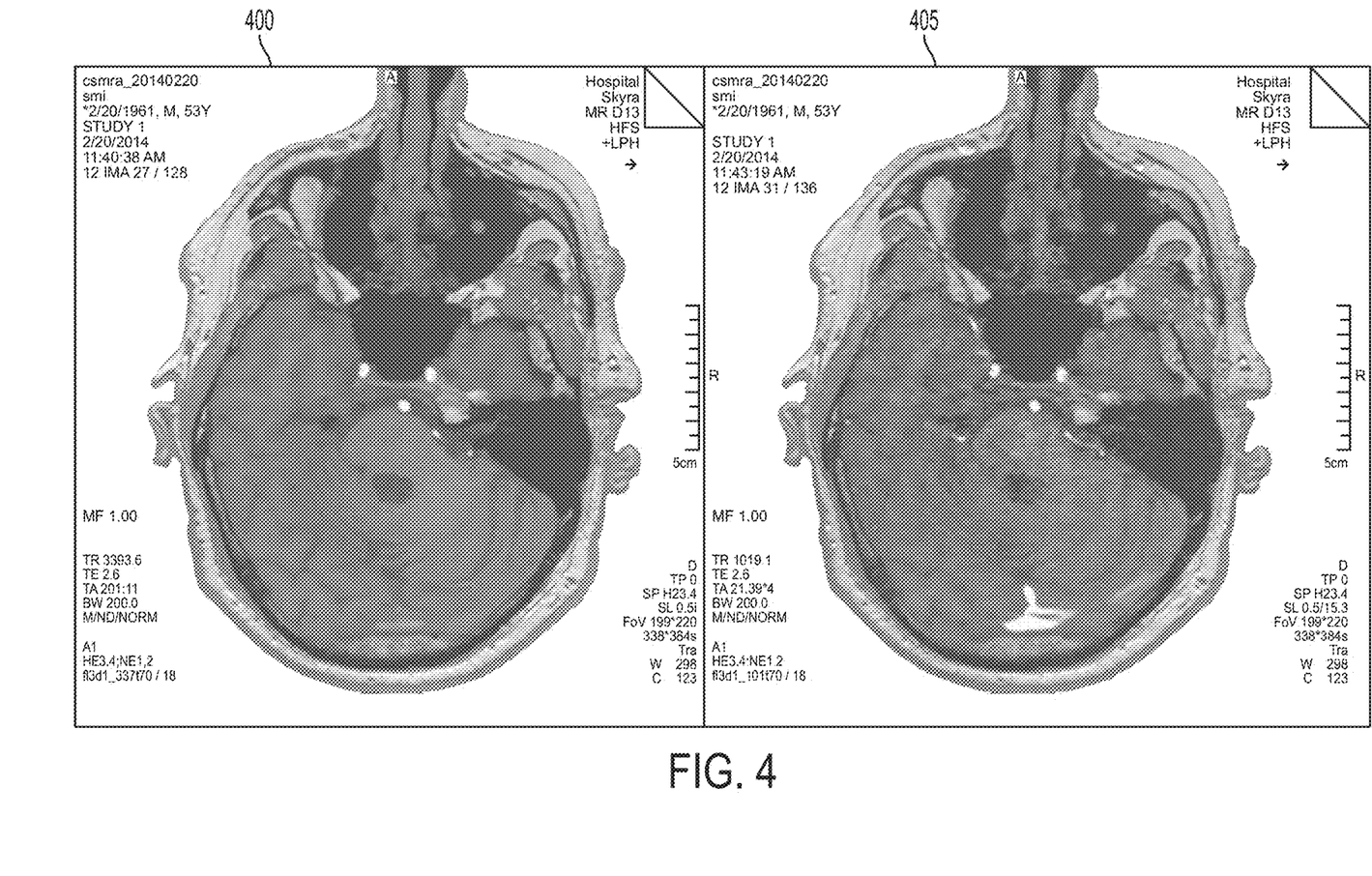
FIG. 4 provides a comparison of compressed-sensing reconstruction when applied to one thick slab and 4 thin slabs with identical coverage, using some of the embodiments described herein.

FIG. 4 provides a comparison of compressed-sensing reconstruction when applied to one thick slab (image 400) and 4 thin slabs (image 405) reconstructed independently for identical overall coverage. As shown in FIG. 4, the image quality is better when reconstructing data from one thick slab compared to 4 independent thin slabs.

Figure 5:
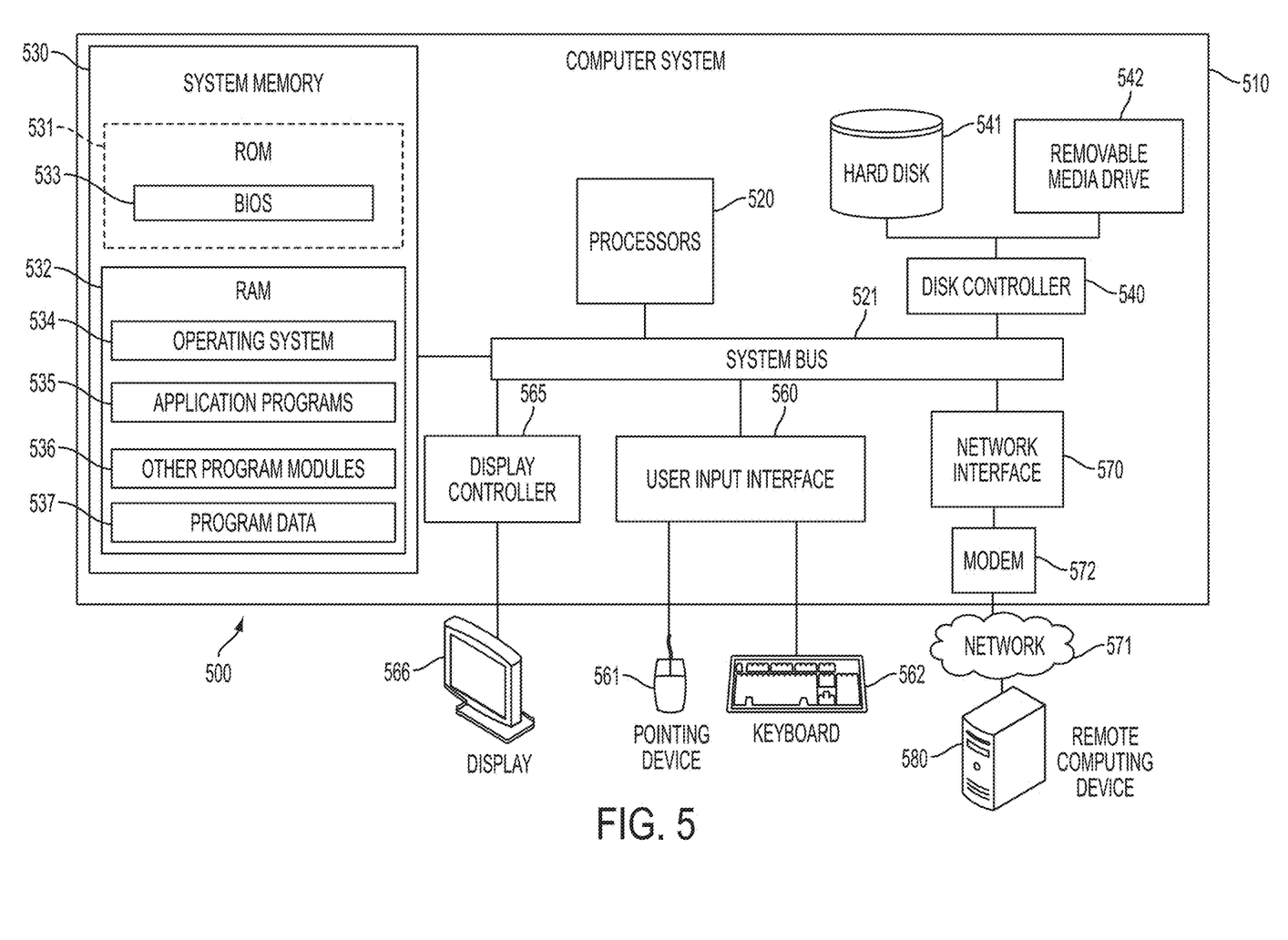
FIG. 5 illustrates an exemplary computing environment within which embodiments of the invention may be implemented.

FIG. 5 illustrates an exemplary computing environment 500 within which embodiments of the invention may be implemented. For example, this computing environment 500 may be used to implement the process 300 of joint reconstruction of three-dimensional slabs described in FIG. 3. In some embodiments, the computing environment 500 may be used to implement one or more of the components illustrated in the system 100 of FIG. 1. The computing environment 500 may include computer system 510, which is one example of a computing system upon which embodiments of the invention may be implemented. Computers and computing environments, such as computer system 510 and computing environment 500, are known to those of skill in the art and thus are described briefly here.

As shown in FIG. 5, the computer system 510 may include a communication mechanism such as a bus 521 or other communication mechanism for communicating information within the computer system 510. The computer system 510 further includes one or more processors 520 coupled with the bus 521 for processing the information. The processors 520 may include one or more central processing units (CPUs), graphical processing units (GPUs), or any other processor known in the art.

The computer system 510 also includes a system memory 530 coupled to the bus 521 for storing information and instructions to be executed by processors 520. The system memory 530 may include computer readable storage media in the form of volatile and/or nonvolatile memory, such as read only memory (ROM) 531 and/or random access memory (RAM) 532. The system memory RAM 532 may include other dynamic storage device(s) (e.g., dynamic RAM, static RAM, and synchronous DRAM). The system memory ROM 531 may include other static storage device(s) (e.g., programmable ROM, erasable PROM, and electrically erasable PROM). In addition, the system memory 530 may be used for storing temporary variables or other intermediate information during the execution of instructions by the processors 520. A basic input/output system 533 (BIOS) containing the basic routines that help to transfer information between elements within computer system 510, such as during start-up, may be stored in ROM 531. RAM 532 may contain data and/or program modules that are immediately accessible to and/or presently being operated on by the processors 520. System memory 530 may additionally include, for example, operating system 534, application programs 535, other program modules 536 and program data 537.

The computer system 510 also includes a disk controller 540 coupled to the bus 521 to control one or more storage devices for storing information and instructions, such as a hard disk 541 and a removable media drive 542 (e.g., floppy disk drive, compact disc drive, tape drive, and/or solid state drive). The storage devices may be added to the computer system 510 using an appropriate device interface (e.g., a small computer system interface (SCSI), integrated device electronics (IDE), Universal Serial Bus (USB), or FireWire).

The computer system 510 may also include a display controller 565 coupled to the bus 521 to control a display 566, such as a cathode ray tube (CRT) or liquid crystal display (LCD), for displaying information to a computer user. The computer system includes an input interface 560 and one or more input devices, such as a keyboard 562 and a pointing device 561, for interacting with a computer user and providing information to the processor 520. The pointing device 561, for example, may be a mouse, a trackball, or a pointing stick for communicating direction information and command selections to the processor 520 and for controlling cursor movement on the display 566. The display 566 may provide a touch screen interface which allows input to supplement or replace the communication of direction information and command selections by the pointing device 561.

The computer system 510 may perform a portion or all of the processing steps of embodiments of the invention in response to the processors 520 executing one or more sequences of one or more instructions contained in a memory, such as the system memory 530. Such instructions may be read into the system memory 530 from another computer readable medium, such as a hard disk 541 or a removable media drive 542. The hard disk 541 may contain one or more datastores and data files used by embodiments of the present invention. Datastore contents and data files may be encrypted to improve security. The processors 520 may also be employed in a multi-processing arrangement to execute the one or more sequences of instructions contained in system memory 530. In alternative embodiments, hard-wired circuitry may be used in place of or in combination with software instructions. Thus, embodiments are not limited to any specific combination of hardware circuitry and software.

As stated above, the computer system 510 may include at least one computer readable medium or memory for holding instructions programmed according to embodiments of the invention and for containing data structures, tables, records, or other data described herein. The term "computer readable medium" as used herein refers to any medium that participates in providing instructions to the processor 520 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 541 or removable media drive 542. Non-limiting examples of volatile media include dynamic memory, such as system memory 530. Non-limiting examples of transmission media include coaxial cables, copper wire, and fiber optics, including the wires that make up the bus 521. Transmission media may also take the form of acoustic or light waves, such as those generated during radio wave and infrared data communications.

The computing environment 500 may further include the computer system 510 operating in a networked environment using logical connections to one or more remote computers, such as remote computer 580. Remote computer 580 may be a personal computer (laptop or desktop), a mobile device, a server, a router, a network PC, a peer device or other common network node, and typically includes many or all of the elements described above relative to computer system 510. When used in a networking environment, computer system 510 may include modem 572 for establishing communications over a network 571, such as the Internet. Modem 572 may be connected to bus 521 via user network interface 570, or via another appropriate mechanism.

Network 571 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 510 and other computers (e.g., remote computer 580). The network 571 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 571.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112, sixth paragraph, unless the element is expressly recited using the phrase "means for.

We claim:

1. A method for acquiring a three-dimensional image volume using a magnetic resonance imaging device, the method comprising:
   performing a multi-slice or multi-slab acquisition process to acquire a plurality of slices or three-dimensional slabs corresponding to an imaged object, each respective slice or three-dimensional slab included in the plurality of slices or three-dimensional slabs comprising k-space data;
   applying an iterative compressed-sensing reconstruction process to jointly reconstruct the plurality of slices or three-dimensional slabs as a single consistent volume, wherein (i) the iterative compressed-sensing reconstruction process uses a combination of the k-space data corresponding to the slices or the three-dimensional slabs, and (ii) the iterative compressed-sensing reconstruction process solves a cost function comprising an inner summation and an outer summation, wherein the inner summation is a summation of individual data fidelity terms from each slice or slab in corresponding to the plurality of slices or three-dimensional slabs and the outer summation is calculated over the number of coils of the magnetic resonance imaging device; and
   presenting an image depicting the single consistent volume on a display.

2. The method of claim 1, wherein each individual data fidelity term corresponds to a comparison of k-space data associated with a respective slice or three-dimensional slab and a masked region of a current estimated image volume corresponding to the respective slice or three-dimensional slab.

3. The method of claim 2, wherein the masked region of the current estimated image volume is a zero-padded matrix of data with non-zero data elements at positions corresponding to the respective slice or three-dimensional slab.

4. The method of claim 1, wherein the cost function further comprises a regularization portion which is independent of a total number of slices or three-dimensional slabs.

5. The method of claim 4, wherein the iterative compressed-sensing reconstruction process uses a proximal gradient algorithm to solve the cost function over a plurality of iterations.

6. The method of claim 4, wherein the regularization portion applies a wavelet transform to a current estimated image volume during each iteration.

7. The method of claim 1, wherein the multi-slice or multi-slab acquisition process is a multi-slab acquisition process which performs incoherent undersampling of the imaged object along a slab direction.

8. The method of claim 1, wherein the multi-slab acquisition process employs an accelerated 3D Time-of-Flight (TOF) sampling strategy.

9. The method of claim 8, wherein the accelerated 3D TOF sampling strategy employs variable density spiral phyllotaxis, or variable density Poisson patterns in ky-kz phase-encoding directions.

10. An article of manufacture for acquiring a three-dimensional image volume using a magnetic resonance imaging device, the article of manufacture comprising a non-transitory, tangible computer-readable medium holding computer-executable instructions for performing a method comprising:
    using a plurality of coils included in the magnetic resonance imaging device to perform an undersampled multi-slab scan of a region of interest to yield a plurality of three-dimensional slabs;
    jointly reconstructing the plurality of three-dimensional slabs as a single consistent volume by solving a cost function comprising an inner summation and an outer summation, wherein the inner summation is a summation of individual data fidelity terms from each slab in corresponding to the plurality of three-dimensional slabs, wherein the cost function uses a combination of k-space corresponding to the three-dimensional slices acquired during the undersampled multi-slab scan and the outer summation is calculated over the number of coils of the magnetic resonance imaging device; and
    presenting an image depicting the single consistent volume on a display.

11. The article of manufacture of claim 10, wherein each individual data fidelity term corresponds to a comparison of k-space data associated with a respective three-dimensional slab and a masked region of a current estimated image volume corresponding to the respective three-dimensional slab.

12. The article of manufacture of claim 11, wherein the masked region of the current estimated image volume is a zero-padded matrix of data with non-zero data elements at positions corresponding to the respective three-dimensional slab.

13. The article of manufacture of claim 10, wherein the cost function further comprises a regularization portion which is independent of a total number of three-dimensional slabs.

14. The article of manufacture of claim 13, wherein the cost function is solved over a plurality of iterations using a proximal gradient algorithm.

15. The article of manufacture of claim 13, wherein the regularization portion applies a wavelet transform to a current estimated image volume during each iteration.

16. The article of manufacture of claim 10, wherein the plurality of three-dimensional slabs are acquired using incoherent undersampling of the region of interest along a slab direction.

17. The article of manufacture of claim 10, wherein the plurality of three-dimensional slabs are acquired using an accelerated 3D Time-of-Flight (TOF) sampling strategy.

18. The article of manufacture of claim 17, wherein the accelerated 3D TOF sampling strategy employs variable density spiral phyllotaxis trajectory in ky-kz phase-encoding directions.

19. A system for performing multi-slab acquisitions with compressed sensing reconstruction, the system comprising:
a display;
an imaging device comprising a plurality of coils configured to acquire a plurality of three-dimensional slabs corresponding to an imaged object, each respective three-dimensional slab included in the plurality of three-dimensional slabs comprising k-space data;
a central control computer unit configured to:
apply an iterative compressed-sensing reconstruction process to the plurality of three-dimensional slabs to yield an image volume, wherein (i) the iterative compressed-sensing reconstruction process uses a combination of the k-space data corresponding to the three-dimensional slabs, and (ii) the iterative compressed-sensing reconstruction process solves a cost function comprising an inner summation and an outer summation, wherein the inner summation is a summation of individual data fidelity terms from each slab in corresponding to the plurality of three-dimensional slabs and the outer summation is calculated over the a number of coils of the magnetic resonance imaging device; and
presenting an image depicting the single consistent volume on the display.

20. The system of claim 19, wherein the central control computer unit is further configured to:
use a proximal gradient algorithm during the iterative compressed-sensing reconstruction process to solve the cost function over a plurality of iterations.

* * * * *